(12) United States Patent
Palaniswamy et al.

(10) Patent No.: US 9,674,938 B2
(45) Date of Patent: Jun. 6, 2017

(54) FLEXIBLE LED DEVICE FOR THERMAL MANAGEMENT

(75) Inventors: Ravi Palaniswamy, Singapore (SG); Arokiaraj Jesudoss, Singapore (SG); Alejandro Aldrin Il Agcaoili Narag, Singapore (SG); James R. White, Singapore (SG); Fong Liang Tan, Singapore (SG); Andrew J. Ouderkirk, St. Paul, MN (US); Justine A. Mooney, Austin, TX (US); Nathan P. Kreutter, Austin, TX (US); Qihong Nie, Woodbury, MN (US); Jian Xia Gao, Singapore (SG)

(73) Assignee: 3M INNOVATIVE PROPERTIES COMPANY, St. Paul, MN (US)

( * ) Notice: Subject to any disclaimer, the term of this patent is extended or adjusted under 35 U.S.C. 154(b) by 701 days.

(21) Appl. No.: 13/883,386

(22) PCT Filed: Oct. 27, 2011

(86) PCT No.: PCT/US2011/057977
§ 371 (c)(1),
(2), (4) Date: Oct. 22, 2013

(87) PCT Pub. No.: WO2012/061183
PCT Pub. Date: May 10, 2012

(65) Prior Publication Data
US 2014/0036461 A1    Feb. 6, 2014

Related U.S. Application Data

(60) Provisional application No. 61/409,801, filed on Nov. 3, 2010, provisional application No. 61/444,374, filed (Continued)

(51) Int. Cl.
*H05K 1/18* (2006.01)
*H05K 1/02* (2006.01)
(Continued)

(52) U.S. Cl.
CPC ........... *H05K 1/0206* (2013.01); *H01L 24/32* (2013.01); *H01L 33/486* (2013.01); *H05K 1/021* (2013.01);
(Continued)

(58) Field of Classification Search
CPC .......... H05K 2201/09827; H05K 2201/09845; H05K 2201/10106; H01L 2924/12032; H01L 2924/12041–2924/12044
(Continued)

(56) References Cited

U.S. PATENT DOCUMENTS

| 4,994,938 A | 2/1991 | Baudouin |
| 5,994,648 A | 11/1999 | Glovatsky et al. |

(Continued)

FOREIGN PATENT DOCUMENTS

| CN | 1825640 | 8/2006 |
| EP | 0338641 | 10/1989 |

(Continued)

OTHER PUBLICATIONS

"Flexible PCB with LED Assembly on Heatsink", Alliance Flextech, [retrieved from the internet on Jul. 24, 2012], 1 page.
(Continued)

*Primary Examiner* — Tuan T Dinh
(74) *Attorney, Agent, or Firm* — Melanie G. Gover; Clifton F. Richardson

(57) ABSTRACT

Provided is a flexible light emitting semiconductor device (26), such as an LED device, that includes a flexible dielectric layer (12) having first and second major surfaces and at least one via (10) extending through the dielectric layer from the first to the second major surface, with a conductive layer (19, 20, 18) on each of the first and second major surfaces and in the via. The conductive layer (18) in the via supports a light emitting semiconductor device (26) and is electrically
(Continued)

isolated from the conductive layer (19) on the first major surface of the dielectric layer.

18 Claims, 8 Drawing Sheets

Related U.S. Application Data on Feb. 18, 2011, provisional application No. 61/524,660, filed on Aug. 17, 2011.

(51) Int. Cl.
  *H01L 33/48*  (2010.01)
  *H01L 23/00*  (2006.01)
  *H01L 33/64*  (2010.01)

(52) U.S. Cl.
  CPC ............ *H05K 1/189* (2013.01); *H01L 33/64* (2013.01); *H01L 2224/45144* (2013.01); *H01L 2224/48091* (2013.01); *H01L 2224/48137* (2013.01); *H01L 2224/48227* (2013.01); *H01L 2224/48472* (2013.01); *H01L 2224/73265* (2013.01); *H01L 2924/01029* (2013.01); *H01L 2924/01322* (2013.01); *H01L 2924/01327* (2013.01); *H01L 2924/12032* (2013.01); *H01L 2924/12041* (2013.01); *H01L 2924/12042* (2013.01); *H01L 2924/15747* (2013.01); *H01L 2924/15787* (2013.01); *H01L 2924/181* (2013.01); *H01L 2924/351* (2013.01); *H05K 2201/09827* (2013.01); *H05K 2201/09845* (2013.01); *H05K 2201/10106* (2013.01)

(58) Field of Classification Search
  USPC ......... 361/782–784, 749; 174/254, 259–261; 257/99; 362/84–94
  See application file for complete search history.

(56) References Cited

U.S. PATENT DOCUMENTS

| | | | |
|---|---|---|---|
| 6,153,928 A | 11/2000 | Cho | |
| 6,320,753 B1 | 11/2001 | Launay | |
| 6,331,063 B1 | 12/2001 | Kamada et al. | |
| 6,412,971 B1 | 7/2002 | Wojnarowski | |
| 6,531,328 B1 | 3/2003 | Chen | |
| 6,614,103 B1 | 9/2003 | Durocher et al. | |
| 6,853,010 B2 | 2/2005 | Slater | |
| 6,936,855 B1 | 8/2005 | Harrah | |
| 7,012,017 B2 | 3/2006 | Brunner | |
| 7,192,795 B2 | 3/2007 | Boardman | |
| 7,199,400 B2 | 4/2007 | Sasuga | |
| 7,303,315 B2 | 12/2007 | Ouderkirk | |
| 7,348,045 B2 | 3/2008 | Yang | |
| 7,745,832 B2 | 6/2010 | Hsieh | |
| 7,763,895 B2 | 7/2010 | Hsiao | |
| 7,800,121 B2 | 9/2010 | Aanegola et al. | |
| 7,871,836 B2 | 1/2011 | Yang | |
| 7,963,674 B2 | 6/2011 | Takekuma | |
| 8,101,966 B2 | 1/2012 | Yen | |
| 8,283,211 B2 * | 10/2012 | Lin | H01L 33/642 257/711 |
| 8,384,121 B2 | 2/2013 | Tischler et al. | |
| 8,455,274 B2 * | 6/2013 | Chen | H01L 33/486 438/113 |
| 2002/0163006 A1 | 11/2002 | Yoganandan | |
| 2003/0039106 A1 | 2/2003 | Koyanagi | |
| 2003/0072153 A1 | 4/2003 | Matsui | |
| 2004/0056260 A1 | 3/2004 | Slater | |
| 2004/0208210 A1 | 10/2004 | Inoguchi | |
| 2005/0247944 A1 | 11/2005 | Haque | |
| 2006/0018120 A1 | 1/2006 | Linehan | |
| 2006/0087866 A1 | 4/2006 | Ng | |
| 2006/0105481 A1 | 5/2006 | Boardman | |
| 2006/0171152 A1 | 8/2006 | Suehiro | |
| 2007/0007558 A1 | 1/2007 | Mazzochette | |
| 2007/0029569 A1 | 2/2007 | Andrews | |
| 2007/0096272 A1 | 5/2007 | Wang | |
| 2007/0120089 A1 | 5/2007 | Mao | |
| 2007/0176198 A1 | 8/2007 | Lee | |
| 2007/0246717 A1 | 10/2007 | Ng | |
| 2007/0253209 A1 | 11/2007 | Loh et al. | |
| 2007/0291503 A1 | 12/2007 | Friedrich | |
| 2007/0292609 A1 | 12/2007 | Speer | |
| 2008/0057333 A1 | 3/2008 | Chu et al. | |
| 2008/0067526 A1 | 3/2008 | Chew | |
| 2008/0079017 A1 | 4/2008 | Loh | |
| 2008/0101071 A1 | 5/2008 | Imai | |
| 2008/0107863 A1 | 5/2008 | Ikeda et al. | |
| 2008/0117619 A1 | 5/2008 | Pang | |
| 2008/0315239 A1 | 12/2008 | Lin | |
| 2009/0071696 A1 | 3/2009 | Yang | |
| 2009/0115926 A1 | 5/2009 | Lim | |
| 2009/0121249 A1 | 5/2009 | Tseng et al. | |
| 2009/0311810 A1 | 12/2009 | Yang | |
| 2010/0079989 A1 | 4/2010 | Yeh | |
| 2010/0096746 A1 | 4/2010 | Tseng | |
| 2010/0155696 A1 | 6/2010 | Duan | |
| 2010/0163897 A1 | 7/2010 | Hsiao | |
| 2010/0165601 A1 | 7/2010 | Yoon | |
| 2010/0277907 A1 | 11/2010 | Phipps | |
| 2011/0003437 A1 | 1/2011 | Lin | |
| 2011/0006318 A1 | 1/2011 | Chung | |
| 2011/0007509 A1 | 1/2011 | Hayes | |
| 2011/0031509 A1 | 2/2011 | Kirihara | |
| 2011/0095315 A1 | 4/2011 | Park | |
| 2012/0002420 A1 | 1/2012 | Imai et al. | |

FOREIGN PATENT DOCUMENTS

| | | |
|---|---|---|
| JP | 3535602 | 6/2004 |
| JP | 2006-319074 | 11/2006 |
| JP | 2010-251376 | 11/2010 |
| TW | 2007-09471 | 3/2007 |
| WO | WO 2012-061010 | 5/2012 |
| WO | WO 2012-061182 | 5/2012 |
| WO | WO 2012-061183 | 5/2012 |
| WO | WO 2012-061184 | 5/2012 |
| WO | WO 2012-112310 | 8/2012 |
| WO | WO 2012-112666 | 8/2012 |
| WO | WO 2012-112873 | 8/2012 |
| WO | WO 2013-025402 | 2/2013 |

OTHER PUBLICATIONS

Ascari, "A miniaturized and flexible optoelectronic sensing system for tactile skin", Journal of Micromechanices and Microengineering, 2007, vol. 17, No. 11, pp. 2288-2298.

Bailey, "Packaging of LED Backlights for Ruggedized Displays", International Symposium on Advanced packaging Materials: Microtech, 2010, pp. 98-101.

Huang, "Applying Surface-mounted LED's in automotive interior and exterior lighting", Proceedings of SPIE, Jan. 18, 2002, vol. 4648, pp. 148-155.

Huber, "Thermal Management Golden DRAGON LED", OSRAM Opto Semiconductor, Apr. 2006, 11 pages.

Kim, "Optimization of Flexible Substrate for COF (Chip on Flexible) LED Packaging", Electronic Components and Technology Conference, May 2009, pp. 1953-1960.

Lee, "Thermo Mechanical Properties High Performance Thermal Interface gap filter pads", Thermal and Thermomechanical Phenomena in Electronic System (ITHERM),, 12$^{th}$ IEEE Intersociety Conference, , Jun. 2010, 8 pages.

Nadarajah, "Flexible Inorganic Nanowire Light-Emitting Diode", Nano Letters, 2008, vol. 8, No. 2, pp. 534-537.

Sagimori, "LED Array With Higher Heat Dissipation by 'Epitaxial Film Bounding' Technology", Special Edition on Component Technologies Supporting Innovative Design, Oki Technical Review, Apr. 2010, vol. 77, No. 1, Issue, 216, pp. 1-6.

(56) References Cited

OTHER PUBLICATIONS

Yum, "Y3Al5O12:Ce0.05 Phosphor Coatings on a Flexible Substrate for Use in White Light-Emitting Diodes", Colloids and Surfaces A: Physicochem. Eng. Aspects, 2004, vol. 251, pp. 203-207.
International Search Report for PCT/US2011/057977 mailed on Jun. 29, 2012 5 pages.

* cited by examiner

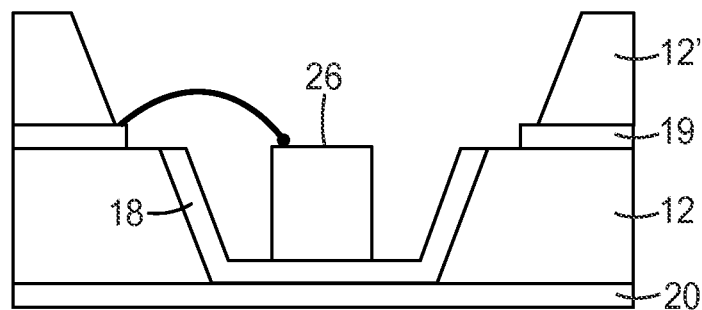
FIG. 8D
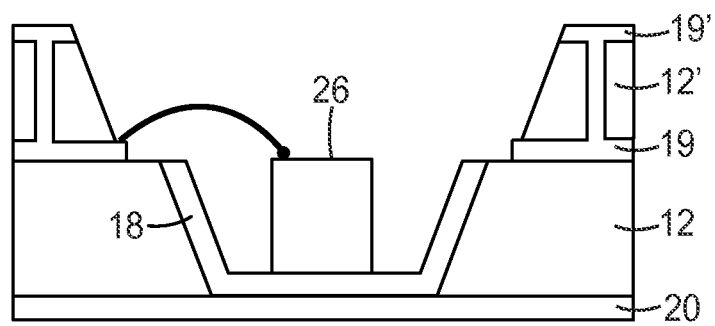
FIG. 8D'
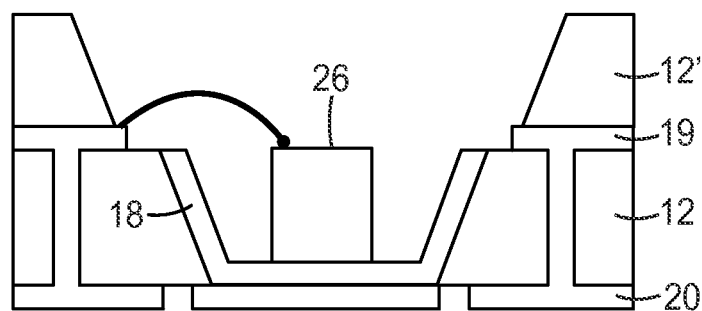
FIG. 8D"

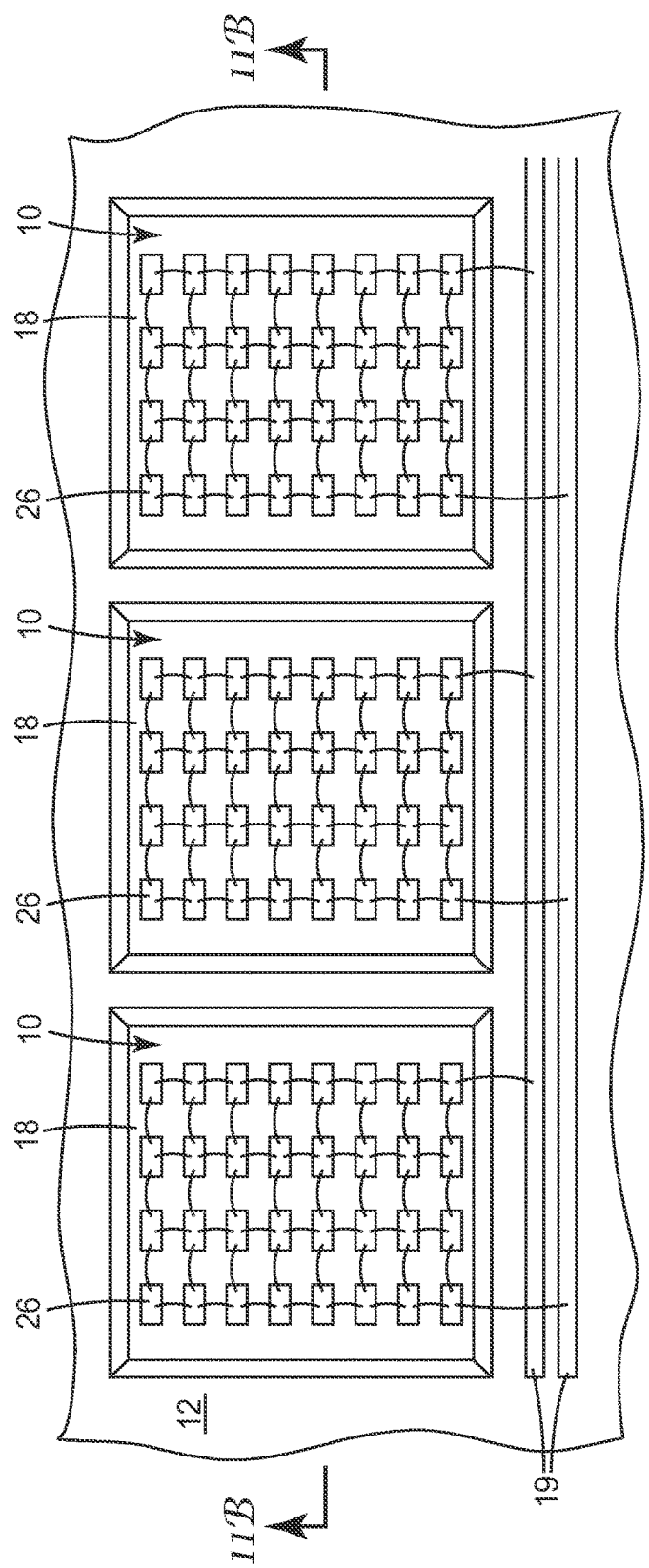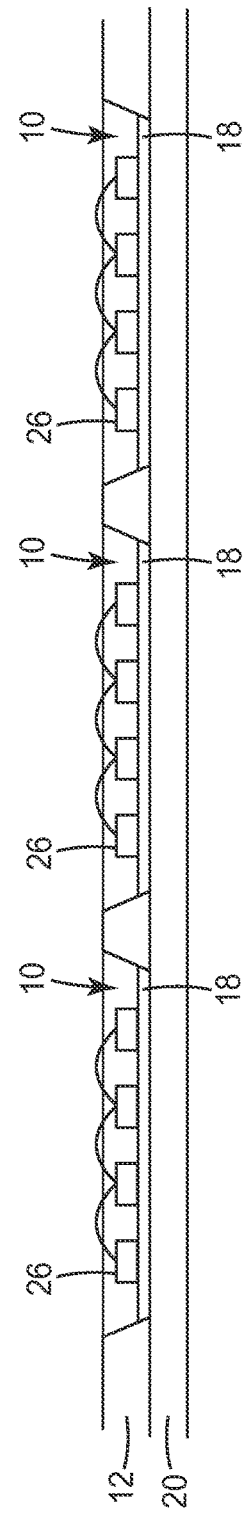
FIG. 11A
FIG. 11B

FLEXIBLE LED DEVICE FOR THERMAL MANAGEMENT

TECHNICAL FIELD

This invention relates to flexible high power light emitting semiconductor devices.

BACKGROUND

Conventional light emitting semi-conductor (LES) devices (LESDs), including light emitting diodes (LEDs) and laser diodes, and packages containing LESDs have several drawbacks. High power LESDs generate a substantial amount of heat that must be managed. Thermal management deals with problems arising from heat dissipation and thermal stresses, which is currently a key factor in limiting the performances of light-emitting diodes.

In general, LES devices are commonly prone to damage caused by buildup of heat generated from within the devices, as well as heat from sunlight in the case of outside lighting applications. Excessive heat buildup can cause deterioration of the materials used in the LES devices, such as encapsulants for the LESDs. When LEDS are attached to flexible-circuit laminates, which may also include other electrical components, the heat dissipation problems are greatly increased.

Additionally, conventional LES devices and packages tend to be thick, which limits their uses in low form factor applications. Consequently, there is a continuing need to improve the design of flexible LES devices and packages to improve their thermal dissipation properties, as well as to allow for their use in low form factors.

Vias in multilayer circuits are used to electrically connect circuit layers that are separated by an insulating material. US 2003/0039106 discloses a double-sided wiring board having an electric connection between the two wiring layers with the use of a via. The electric connection is made more reliable by removing debris from the interface of the two wiring layers in the recess.

SUMMARY

At least one aspect of the present invention provides a cost-effective thermal management solution for current and future high power LESD constructions through a robust flexible LESD construction having conductive layers on both surfaces of a dielectric layer and a conductive layer in a via in the dielectric layer wherein the conductive layer in the via does not establish a direct electrical connection between the conductive layers on the surfaces of the dielectric layer. The ability to dissipate large amounts of heat is needed for the operation of high power LESD arrays. According to at least one embodiment of the present invention, heat dissipation can be managed by integrating the LESDs into a system having a flexible polymeric dielectric substrate, i.e., a dielectric layer. To accomplish better heat management, LESDs are positioned directly or indirectly on a conductive layer located in a via that extends through the dielectric layer, which conductive layer is in thermal contact with an adjacent thermally conductive layer located on the bottom surface of the dielectric layer. In at least one embodiment of the present invention, to create the via and subsequently achieve the positioning of the LESD on the conductive layer in the via, etching through the dielectric layer is performed. Etching of the dielectric layer provides additional advantages by creating slanted side walls which can be coated with a reflecting layer to provide enhanced light efficiency. Additionally, in at least some embodiments, because the LESD sits below the surface of the dielectric layer, it has a lower profile than standard LES devices, which makes it well-suited for low form factor applications.

At least one aspect of the present invention provides an article comprising a flexible polymeric dielectric layer having first and second major surfaces, the dielectric layer having an array of vias extending from the first major surface to the second major surface, the first major surface having a first conductive layer thereon and the second major surface having a second conductive layer thereon, the vias being defined by walls comprising the dielectric material and the second conductive layer covering the via opening in the second major surface of the dielectric layer, at least one via having a third conductive layer on at least a portion of its walls and on at least a portion of the second conductive layer covering the via opening in the second major surface of the dielectric layer; the third conductive layer configured to directly or indirectly support a light emitting semiconductor device, wherein the first conductive layer is electrically conductive and the second and third conductive layers are thermally conductive, and wherein the third conductive layer provides no direct electrical connection between the first and the second conductive layers.

As used in this application: "LES" means light emitting semiconductor(s), including light emitting diodes and laser diodes and "LESD" means light emitting semiconductor devices, including light emitting diode device(s) and laser diode device(s). An LESD may be a bare LES die construction; a complete packaged LES construction; or an intermediate LES construction comprising more than the bare die, but less than all the components for a complete LES package, such that the terms LES and LESD may be used interchangeably and refer to one or all of the different LES constructions. The term "flexible LES device" or "flexible LESD" typically refers to the flexible article containing the bare die light emitting semiconductor, packaged LES construction, or intermediate LES construction.

An advantage of at least one embodiment of the present invention is:

The flexible LES devices provide excellent heat dissipation, which is needed for high power LESDs.

The flexible LES devices can be wired as an array on a single flexible insulating layer.

The wall slopes of the vias in which the LESDs are located can help to reflect light emitted by the LESDs, which results in better light management.

The resulting flexible LES devices can be bent in simple or compound curves.

The use of a flexible layer with LESDs can eliminate the cost associated with conventional submounts.

The resulting flexible LES devices can provide a robust, cost-effective thermal management solution to the current and future high power LED constructions.

The direct contact of the conductive layer supporting the LESDs and the conductive layer on the bottom side of the dielectric layer enable better heat dissipation than in standard constructions.

Using the same or similar material for the conductive layer supporting the LESDs and the conductive layer on the bottom side of the dielectric layer can significantly reduce the interface thermal resistance.

The above summary of the present invention is not intended to describe each disclosed embodiment or every implementation of the present invention. The Figures and detailed description that follow below more particularly exemplify illustrative embodiments.

BRIEF DESCRIPTION OF DRAWINGS

FIGS. 8A-8D" depict a process for making embodiments of flexible LESDs of the present invention, and the resulting flexible LESDs.

FIGS. 11A-11B depict an embodiment of a flexible LESD of the present invention.

DETAILED DESCRIPTION

In the following description, reference is made to the accompanying set of drawings that form a part of the description hereof and in which are shown by way of illustration several specific embodiments. It is to be understood that other embodiments are contemplated and may be made without departing from the scope or spirit of the present invention. The following detailed description, therefore, is not to be taken in a limiting sense.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein. The use of numerical ranges by endpoints includes all numbers within that range (e.g. 1 to 5 includes 1, 1.5, 2, 2.75, 3, 3.80, 4, and 5) and any range within that range.

Unless otherwise indicated, the terms "coat," "coating," "coated," and the like are not limited to a particular type of application method such as spray coating, dip coating, flood coating, etc., and may refer to a material deposited by any method suitable for the material described, including deposition methods such vapor deposition methods, plating methods, coating methods, etc. In addition, directional terminology, such as "top," "bottom," "front," "back," "above," "below," etc., is used with reference to the orientation of the Figure(s) being described. Because components of embodiments can be positioned in a number of different orientations, the directional terminology is used for purposes of illustration and is in no way limiting. In general similar reference numbers are used for similar features in the various embodiments. Unless indicated otherwise, these similar features may comprise the same materials, have the same attributes, and serve the same or similar functions. Additional or optional features described for one embodiment may also be additional or optional features for other embodiments, even if not explicitly stated, where appropriate.

Figure 1:
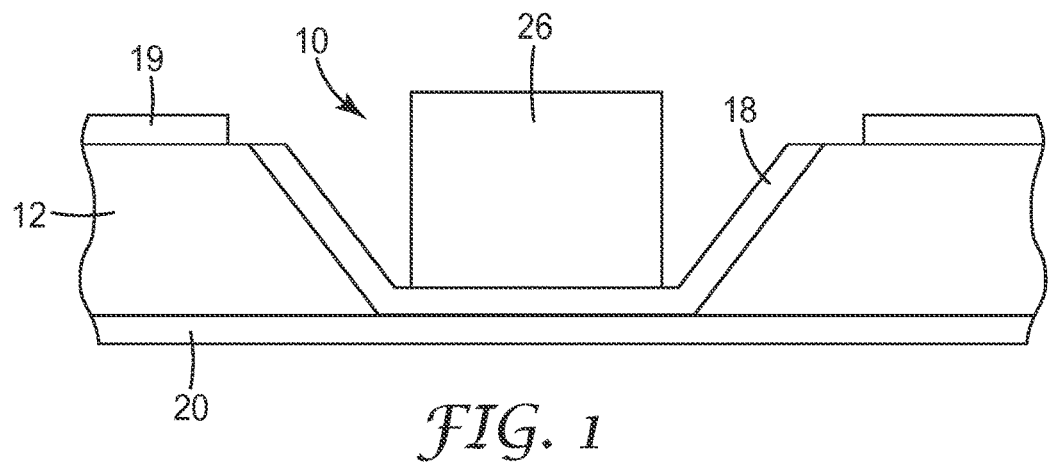
FIG. 1 depicts an embodiment of a flexible LESD of the present invention.

At least one embodiment of the present invention is illustrated in FIG. 1, which shows flexible dielectric layer 12 having at least one via 10 in which is located LESD 26. Via 10 is an opening extending through the dielectric layer from one surface to the other. It is initially defined by walls comprising the dielectric layer but may be further defined by layers and coatings applied to the walls. It is closed off at one end by conductive layer 20 located on the bottom surface of dielectric layer 12. Layers and coatings applied to the via walls may also be applied to the portion of conductive layer 20 beneath the bottom opening of via 10. (Although the plural term "via walls" is used herein, this term also refers to a single continuous curved wall such as those with a conical or frustoconical shape.) Via 10 may be any suitable shape, e.g., circular, oval, rectangular, serpentine, a channel, a grid (e.g., forming islands of dielectric layer separated by a continuous pattern of overlapping channels), etc. A via may contain a single LESD 26 or may contain multiple LESDs. For example, if the via is channel-shaped, grid-shaped, or large, multiple LESDs may be located in a single via. In the embodiment of FIG. 1, the via walls and exposed portion of conductive layer 20 support conductive layer 18. In other embodiments, conductive layer 18 may support additional materials such as additional conductive materials and/or additional layers such as a reflective coating. Conductive layer 19 is located on the top surface of dielectric layer 12. Conductive layer 19 is typically electrically conductive and, in some embodiments, also thermally conductive. In some embodiments, conductive layer 19 comprises an electrically conductive circuit. LESD 26 may be wire bonded to such electrically conductive circuit. Conductive layer 18 directly or indirectly supports LESD 26 in via 10. In some embodiments, a passivation or bonding layer is located beneath LESD 26 to facilitate bonding LESD 26 to an underlying layer. In some embodiments, conductive layer 18 may comprise a portion of conductive layer 19 that is located in via 10 or may comprise a separate conductive layer that is deposited on the walls of via 10 and on the portion of conductive layer 20 adjacent the via opening in the second surface of dielectric layer 12.

Conductive layer 18 is typically thermally conductive, and in some embodiments, also electrically conductive. Conductive layer 18 typically has a relatively uniform thickness and generally follows the contours of an underlying surface. Additional conductive matter forming conductive material 18' (see, e.g., FIG. 3) may optionally be deposited over conductive layer 18 in the via, for example, if conductive layer 18 is less than the desired thickness within via 10. Conductive layer 18 and conductive material 18' may comprise the same or different matter. For example, both might be copper, or conductive layer 18 might be copper while conductive material 18' might be solder. If conductive layer 18 and conductive material 18' comprise the same matter, the interface between the two may be obscured. Conductive layer 18 is thermally, and optionally electrically, connected to conductive layer 20, but is not directly electrically connected to conductive layer 19. It is to be noted that in some embodiments a portion of conductive layer 19, which portion is electrically isolated from the remaining portion of conductive layer 19, extends from the first surface of dielectric layer 12 into via 10. In such a case, this portion of conductive layer 19 is considered to be part of conductive layer 18.

Conductive layer 20 is typically thermally conductive and, in some embodiments, also electrically conductive. In some embodiments, conductive layer 20 comprises an electrically conductive circuit. In such a case, if conductive layer 18 and any intermediate layer is also electrically conductive, an LESD in via 10 having a bottom electrode may be electrically connected to such circuit.

At least one embodiment of the present invention provides a flexible LESD array construction using an etched dielectric layer. At least one via 10 is etched through the dielectric layer 12. The via may have a conductive layer 18 deposited therein in any suitable manner, such as coating, vapor deposition, chemical deposition, plating, etc., but conductive layer 18 is typically plated either using electro or electroless plating. Conductive material 18', if added, may be deposited in any suitable manner such as coating vapor deposition, chemical deposition, plating, dispensing, etc. LESDs are typically physically attached, directly, or indirectly (e.g., if there are intervening materials or layers), to conductive layer 18 (or conductive material 18') using a known die bonding method such as eutectic, solder (including solder bumps for flip chip mounting), adhesive, and fusion bonding. Because the via forms an opening through the dielectric layer, the conductive layer in the via and the conductive layer on the bottom surface of the dielectric layer are in direct electrical and thermal contact, which allows for dissipating heat generated by the LESD efficiently through the conductive layer 18 in the via to conductive layer 20 on the bottom surface of the dielectric layer 12.

Suitable conductive matter for use in the electrically and/or thermally conductive layers of the present invention will depend on the application, but may include, for example, metals such as copper, silver, gold, nickel, aluminum, tin, and alloys thereof; thermally and electrically conductive polymers and adhesives, including non-conducting polymers and adhesives filled with conductive material, e.g., conductive particles, such that the resulting polymer or adhesive is conductive.

Suitable conductive matter for use in the conductive materials of the present invention will also depend on the application, but may include metals such as copper, gold, silver, nickel aluminum, tin, and alloys thereof as well as solders, conductive polymers, and conductive adhesives, including non-conductive polymers and adhesives filled with conductive material, e.g., conductive particles, such that the resulting matter is conductive.

Suitable electrically and/or thermally conductive particles include aluminum, gold, silver, chromium, copper, palladium, nickel and alloys thereof, aluminum nitride (AlN), aluminum oxide (Al2O3), barium nitride (BN), nanometer-sized silver particles, carbon blacks, carbon nanotubes (CNT), fullerenes, graphenes, carbon fillers, barium titanate, barium strontium titanate, titanium oxide, lead zirconium titanate, calcium copper titanate, lead magnesium titanate, lead lanthanium zirconate titanate, silicon dioxide, and mixtures thereof.

Suitable polymeric materials for use in the flexible polymeric dielectric layer of the present invention include, but are not limited to, polyesters, polycarbonates, liquid crystal polymers, and polyimides. Polyimides are preferred. Suitable polyimides include those available under the trade names KAPTON, available from DuPont; APICAL, available from Kaneka Tex. corporation; SKC Kolon PI, available from SKC Kolon PI Inc.; and UPILEX and UPISEL including UPILEX S, UPILEX SN, and UPISEL VT, all available from Ube Industries, Japan. These UPILEX and UPISEL polyimides are made from monomers such as biphenyl tetracarboxylic dianhydride (BBDA) and phenyl diamine (PDA).

Vias may be formed in the dielectric layers using any suitable method such as chemical etching, plasma etching, focused ion-beam etching, laser ablation, embossing, micro-replication, injection molding, and punching. Chemical etching may be preferred in some embodiments. Any suitable etchant may be used and may vary depending on the dielectric layer material. Suitable etchants may include alkali metal salts, e.g. potassium hydroxide; alkali metal salts with one or both of solubilizers, e.g., amines, and alcohols, such as ethylene glycol. Suitable chemical etchants for some embodiments of the present invention include KOH/ethanol amine/ethylene glycol etchants such as those described in more detail in U.S. Patent Publication No. 2007-0120089-A1, incorporated herein by reference. Other suitable chemical etchants for some embodiments of the present invention include a KOH/glycine etchants such as those described in more detail in co-pending U.S. Provisional Patent Application No. 61/409,791, incorporated herein by reference. Subsequent to etching, the dielectric layers may be treated with an alkaline KOH/potassium permanganate (PPM) solution, e.g., a solution of about 0.7 to about 1.0 wt % KOH and about 3 wt % $KMnO_4$.

The dielectric layers may be clad on one or both sides with a conductive layer. If the conductive layer(s) are to be formed into circuits, they may be pre-patterned, or may be patterned during the process of making the flexible LESD devices. A multilayer flexible layer (having multiple layers of dielectric and conductive material) may also be used as a substrate. The conductive layers may be any suitable material, but are typically copper.

Figure 2A:
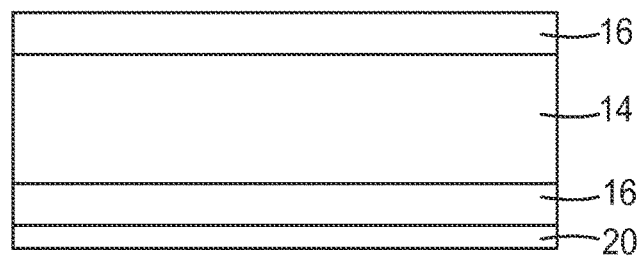
FIGS. 2A-2B depict a process for preparing a dielectric layer of the present invention.
Figure 2B:
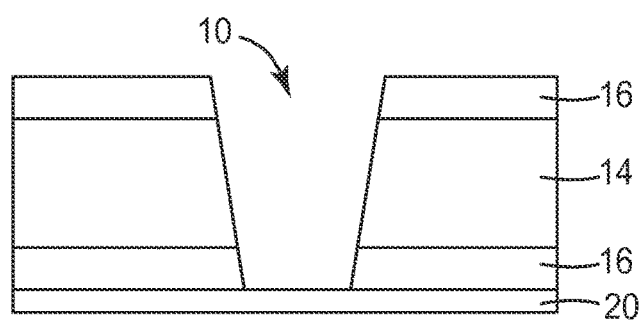

FIGS. 2A-2B illustrate a UPISEL VT dielectric layer clad on one side with a copper layer 20 (the structure being commercially available under the trade designation UPILEX N from Ube Industries, Japan) having a via 10 etched according to an embodiment the present invention. As shown in FIG. 2A, UPISEL VT is constructed of a core layer 14 comprising UPILEX S and thin outer layers 16 comprising a thermoplastic polyimide (TPPI). The UPISEL VT may be etched using any suitable chemistry, such as KOH/ethanol amine/ethylene glycol described in more detail on U.S. Patent Publication No. 2007-0120089-A1. With this etchant, it was found that the hydrophobic nature and higher modulus of the UPILEX S resulted in etching by a dissolution mechanism that made the side walls of the via very smooth. As shown in FIG. 2B, the etchant formulation etched through both TPPI layers and the core layer to provide an opening exposing the copper layer clad on the bottom surface of the dielectric layer.

The side wall angle resulting from chemical etching varies, and is most dependent on etch rate, with slower etching rates resulting in shallower (i.e., closer to 0°) side wall angles. Typical side wall angles resulting from chemical etching are about 5° to about 60° from the major plane of the dielectric layer, and in at least one embodiment, about 25° to about 28°. As previously mentioned as an alternative to chemical etching, vias in the dielectric layer may be formed by punching, plasma etching, focused ion-beam etching, and laser ablation. With these methods of forming a via, the side walls typically have a steeper angle, e.g., up to 90° from the major plane of the dielectric layer. For purposes of this application, a sloped side wall means a side wall that is not perpendicular to the horizontal plane of the dielectric layer. Vias with sloped sidewalls could also be made using methods such as embossing, microreplication, and injection molding.

Conductive layer 20 may be applied to the bottom side of the dielectric layer 12 before via 10 is formed if the via-forming method would not destroy the conductive layer, e.g., because the via-forming method will not etch or degrade the conductive layer, such as with plasma etching, or it may be added after the via is formed if the via-forming method would destroy the conductive layer, such as with punching. In at least one embodiment of the present invention, conductive layer 20 is a thermally, and optionally electrically, conductive adhesive. The adhesive layer may be used as an etch stop or may be applied to the dielectric layer 12 after via 10 is formed. If the conductive adhesive is used as an etch stop, suitable adhesives are those that are resistant to chemicals, especially those resistant to alkali solutions. After via 10 is formed, conductive layer 18 can be applied, e.g., by electroplating, in via 10, including on the thermally conductive adhesive that covers the via opening. Other layers may be applied to the opposite side of the thermally conductive adhesive layer (before or after the adhesive is applied to the dielectric layer). For example, thermal interface materials, metal foils, rigid metal plates, heat sinks, etc. can be attached to the adhesive layer. Having the thermally conductive adhesive layer covering the via opening can enhance the dissipation of heat away from the LESD which sits in the via. The thermal conductivity of the adhesive can be tailored by adding required amount of suitable thermally conductive particle and by tailoring the thickness of the adhesive. Typical thermally conductive particle used in thermally conductive adhesives are aluminum nitride (AlN), aluminum oxide ($Al_2O_3$), barium nitride (BN), nanometer-sized silver particles, carbon nanotubes (CNT), fullerenes, graphenes, carbon fillers, etc. The size of the particles are typically in the sub-micron to micron range. The typical thermal conductivity of such filled adhesives is from about 0.2 to about 6 W/mK.

Suitable adhesive types for use in thermally conductive adhesives include, but are not limited to, epoxies, polyurethanes, polyamideimides, and phenolic resins.

Suitable curing processes for the thermally conductive adhesives include, but are not limited to, thermal, UV, E-beam, UV-beta stage (a combination of UV and thermal cure in which the adhesives are coated onto a liner, subjected to an initial UV cure, then laminated onto a substrate and thermally cured), and combination thereof.

If the adhesive is adhered to a conductive, e.g., copper, layer before being applied to the dielectric layer, the adhesive typically is either coated on a liner and laminated with a copper foil or coated directly on the copper foil. Electrodeposited or rolled annealed coppers are preferred. If the copper has a rough side and a smooth side, it is typically preferable to attach the adhesive to the rough side.

Figure 3:
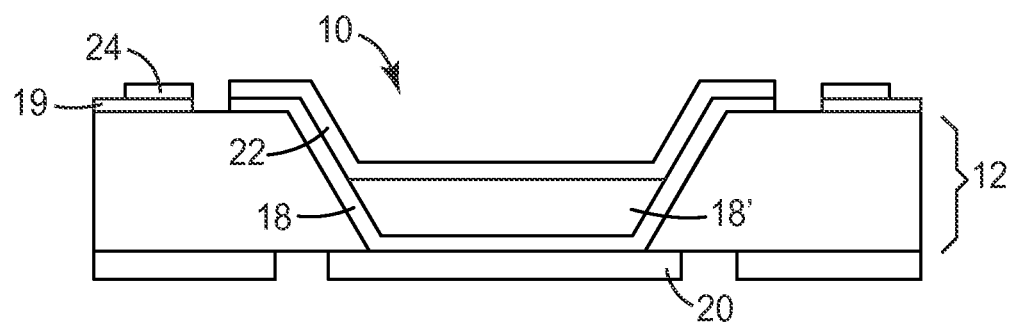
FIG. 3 depicts an embodiment of a layer of the present invention prepared to receive an LES device.

FIG. 3 illustrates an embodiment of the present invention in which a via 10 has been formed in dielectric layer 12. An array of similar vias may be formed in the dielectric layer. Conductive layer 18 has been applied over the bottom opening and on the walls of the via and extends up onto the top surface of the dielectric layer 12. On the central portion of conductive layer 18 is added conductive material 18'. Conductive layer 18 and conductive material 18' are electrically isolated from conductive layer 19 on the top surface of the dielectric layer 12. Conductive layer 19 may comprise a circuit.

In at least some embodiment of the present invention, the combined matter of conductive layer 18 and conductive material 18' may be as thin on the bottom opening of the via as it is on the via walls, or it may be thinner or thicker. If it is thicker, it may partially or fully fill the via. In the embodiment of FIG. 3, the added conductive material 18' results in a thicker amount of conductive matter over the bottom opening of via 10 and on the lower portion of the via walls than on the upper portion of the via walls and, therefore, conductive matter partially, e.g., about 50%, fills the via. Conductive layer 18 and material 18' may be any suitable thickness, e.g., 10%, 15%, 25% or greater of the via depth. In some embodiments, the conductive layer 18 and material 18' fill a larger percentage of the via, e.g., about 50%, about 75%, or about 100%. Although in many instances in this application, reference is made only to conductive layer 18 in via 10, it is to be understood that conductive material 18' may also exist in via 10, even though it is not explicitly mentioned. Conductive layer 20 is adjacent the bottom surface of the dielectric layer 12. Conductive layer 20 may be any suitable thickness. Because conductive layer 18 and conductive layer 20 are located adjacent to each other at the bottom opening of via 10, they can act in conjunction to dissipate heat away from the LESD. In some embodiments, conductive layer 18 may be made thin and conductive layer 20 may be made thick, or vice versa, to achieve desired heat transfer properties.

In at least some embodiment of the present invention, a reflective coating 22 may further be applied over conductive layer 18 and conductive material 18' in the via. The reflective coating may be gold, silver, aluminum with enhanced reflectivity, an inherently reflective dielectric material, or a pigmented material. The reflective coating may exist between the conductive material and the LESD or may be absent under the LESD so that the LESD sits directly on the conductive layer (or another intermediate layer). If the reflective coating is located between the conductive layer and the LESD, it is preferably thermally conductive and/or thin to allow for the transfer of heat from the LESD to the conductive layer 18. Conductive bumps 24 (which may be Au, AuSn, AuGe, AuSi, or other suitable materials) are added for wire bonding the LESD to conductive layer 19.

Figure 4:
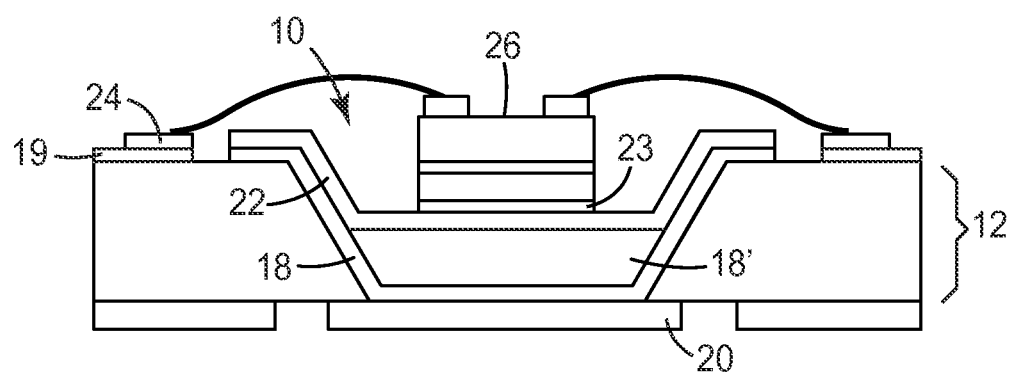
FIG. 4 depicts an embodiment of a flexible LESD of the present invention.

FIG. 4 illustrates an embodiment of the present invention similar to FIG. 3 in which passivation layer 23 has been applied to the bottom of LESD 26 to facilitate die bonding of the LESD 26 to reflective layer 22. Suitable passivation materials include metals such as Au and intermetallic alloys(s) such as AuSn, AuGe, AuSi. LESD 26 is wire bonded to conductive bumps 24. Different types of die bonding such as eutectic, fusion, and adhesive bonding can be employed to attach the LESD in the via. With some types of bonding, e.g., eutectic bonding, it is preferable to deposit metals or intermetallic alloys on the bottom of the LESD, as is illustrated in this embodiment, to facilitate bonding to the conductive layer/material or reflective coating (or other intermediate layer) on the flexible dielectric layer. The temperature involved for attaching the LESD to the conductive layer/material in the via is typically between about 250° C. and 325° C., most typically about 285° C. for eutectic bonding with Au/Sn. The LESDs may be adhered by other methods such as organic die attach, e.g., using silver epoxy, or soldering. Eutectic bonding is considered a direct bonding method while soldering is considered an indirect bonding method.

At least some embodiments of the flexible LES devices of the present invention provide excellent heat management properties. Due at least in part to the conductive layers in the vias that supports the LESDs, heat generated by the LESDs can be readily transmitted to the conductive layer on the bottom side of the dielectric layer. In this manner, heat can be readily conducted away from the LESD. Additionally, having a conductive layer in the via that essentially follows the contours of the via can maximize the surface area of the conductive layer, which may improve heat dissipation. Vias with shallow angles will, in general, provide walls with larger surface areas, which may provide better heat dissipation. In at least some embodiments of the present invention, a thickness of at least about 50 micrometers (um) for the bottom conductive layer 20 was found to achieve good thermal and structural performances. Additionally, the amount of conductive matter in the via can be controlled to further influence heat management. In some embodiments in which a portion of conductive layer 19 extends into via 10, including over the bottom opening of via 10, thus forming all or part of conductive layer 18, the entire conductive layer 19 may be made relatively thick and no additional conductive material is added in via 10. In at least some embodiments of the present invention, it was found that a conductive, e.g., copper, layer 19, with a thickness of about 50 um to about 100 um, preferably about 75 um to about 100 um on the dielectric layer surface, and in the via, significantly enhanced heat dissipation from the LESD and/or solder layer beneath the LESD to conductive layer 20. Having this thick conductive layer 18 in the via provided enhanced vertical and lateral heat spreading from the LESD and/or solder layer to the conductive layer 18 and then to conductive layer 20.

The inventors also found that in at least some embodiments of the present invention controlling the area dimensions of the bottom opening of via 10 and, therefore, the area dimensions of conductive layer 18 over the bottom opening can significantly influence heat dissipation from the LESD and/or the solder layer beneath the LESD to conductive layer 18, and further to the conductive layer 20 adjacent the bottom via opening. Generally, increasing the ratio of the via opening area to the LESD footprint area provides better heat dissipation. It was found that ratios of 1:2 (LESD footprint: bottom via opening) and above showed improvement with respect to heat dissipation over a 1:1 ratio, with a ratio of 1:3 showing the most significant increase in heat dissipation. It is believed that this ratio helps dissipate heat in the z direction before spreading the heat out over a larger surface area, e.g., using an adjacent heat transfer layer. Although a ratio of 1:2 helps with heat dissipation and higher ratios such as 1:4 may be used, it was found that a 1:3 ratio provided a significant improvement over, e.g., a 1:1 ratio, while a 1:4 ratio provided only an incremental improvement over a 1:3 ratio.

The LESDs can be packaged directly on the flexible dielectric layer, e.g., by applying an encapsulating material over individual LESDs and the vias on or in which they are located, or by applying an encapsulant over an array of LESDs and the conductive layer around such LESDs. The encapsulant is preferably a transparent (i.e., having a transmittance over 99%) molding compound.

In at least one embodiment of the present invention, the encapsulant is a transparent color conversion material, which can absorb light emitted from the LES of the LESD and re-emit the light at a different, typically higher, wavelength. For example, a color conversion material containing yellow phosphors may be used to encapsulate a blue LED, which can product a white light. In some embodiments of the present invention, the slopes of the via sidewalls can be tailored to create a uniform thickness of the color conversion layer surrounding the LESD to provide uniform light conversion, and preferably, superior thermal management. In at least one embodiment of the present invention, the slopes of the via sidewalls are about 5° to about 90°. An advantage of at least one embodiment of the present invention is that placing the LESD in a via enables precise placement of the encapsulant because it can be contained in the via. An advantage of at least one embodiment of the present invention is that placing the LESD in the center of a via and filling the via with encapsulant creates uniform light conversion due to the uniform layer of encapsulant that can be created around the LESD. In an alternate embodiment of the present invention, instead of encapsulating the LESD with the color conversion material, a layer of the color conversion material is coated at the bottom of the via prior to placing the LESD in the via. In this manner, the color conversion material can absorb at least some of the light emitted from the LES and re-emit the light at a different, typically higher, wavelength. An example of a suitable color conversion material is a phosphor-filled encapsulant. Such an encapsulant may be made by mixing yellow phosphor, such as that available under the trade designation ISIPHOR SSA612100 from Merck, with a suitable silicone encapsulant having suitable adhesion properties. A weight ratio of 75% phosphor to silicone adhesive may be suitable in some embodiments. After the encapsulant is dispensed into the via, in some embodiments it may be cured by exposure to UV light at 80° C. for an hour.

The encapsulant may optionally be suitable to act as a lens when cured. Silicones and epoxies are suitable encapsulating compounds. The encapsulant may further contain optical diffusing particles distributed therein. Suitable encapsulating (molding) compounds may be purchased, e.g., from Shin-Etsu Chemical Co., Ltd., of Japan and NuSil Silicone Technology of Santa Barbara, Calif. If desired, a wavelength converting material, such as a phosphor coating, may be deposited on top of the LESD prior to encapsulation. An underfill material may optionally be applied prior to encapsulating the LESD. The flexible LES devices may also be enclosed in a waterproof/weatherproof, transparent casing, which may be made from any suitable polymeric transparent material.

Figure 5:
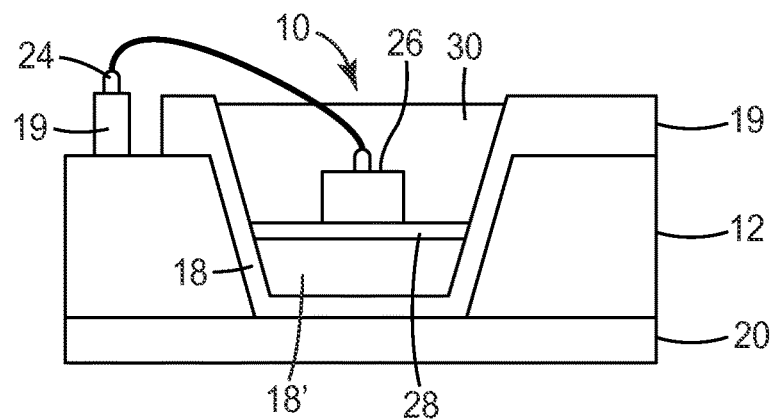
FIG. 5 depicts an embodiment of a flexible LESD of the present invention.

FIG. 5 illustrates an embodiment of the present invention in which a via structure similar to that in FIGS. 3 and 4 has been formed in dielectric layer 12, an LESD 26 having a height less than the depth of via 10 has been attached to conductive material 18' in via 10 with solder 28, and the via has been filled with encapsulant 30 that covers the LESD. A wire bond extends out of encapsulant 30 and connects with bond pad 24.

Figure 6:
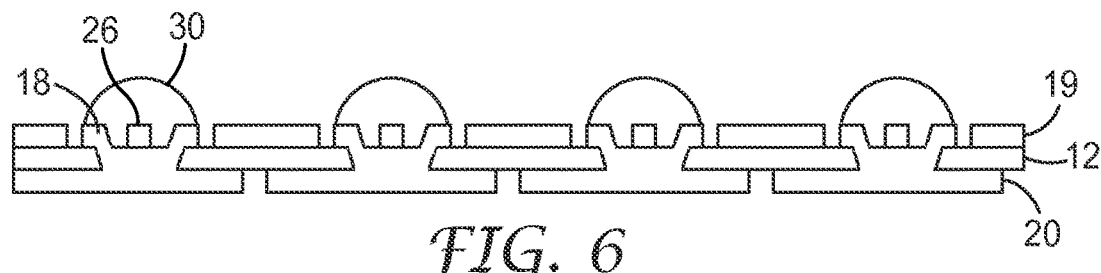
FIG. 6 depicts an embodiment of a flexible LESD of the present invention.

FIG. 6 illustrates an embodiment of a flexible LES device of the present invention in which a dielectric layer 12 has conductive layers 19 and 20 on its top and bottom surfaces, respectively, as well as vias containing conductive layer 18 that support LES devices 26 covered by encapsulant 30. In this embodiment and in other embodiments of the present invention, the dielectric layer and conductive layers support and surround the LESDs, thereby providing a flexible, robust LESD.

Figure 7A:
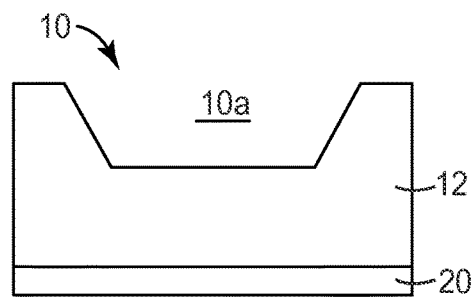
FIGS. 7A-7D depict a process for making an embodiment of a flexible LESD of the present invention, and the resulting flexible LESD.
Figure 7B:
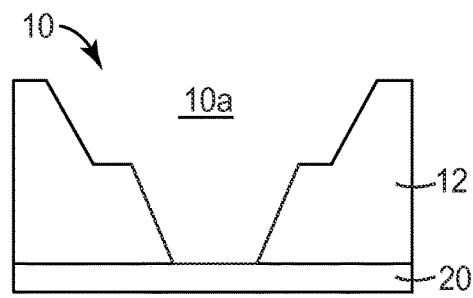
Figure 7C:
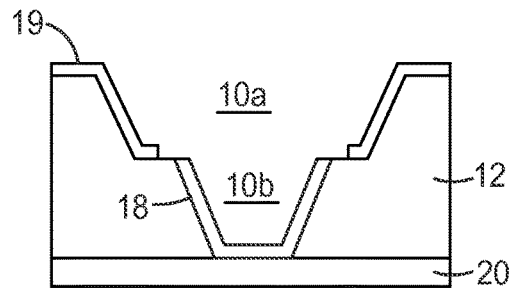
Figure 7D:
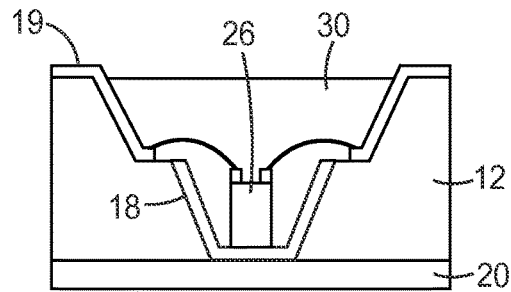

FIGS. 7A-7D illustrates a method of making an alternate embodiment of the present invention in which the LESD has a height less than the depth of the via. In the embodiment of FIGS. 7A-7D, the LESD can be wire bonded inside the via and the wire bonds can be encapsulated, thereby increasing the robustness of the wire bonds in the final embodiments. In this embodiment, via 10 has an upper portion 10a near the first major surface of dielectric layer 12 and a lower portion 10*b* near the second major surface and the diameter of the upper via portion 10*a* is greater than the diameter of the lower via portion 10*b*. The slopes of the upper and lower via portions can be any slopes that are suitable for the desired application and can be the same or different. Each slope will typically be between about 5° to about 90°. This embodiment can be created by starting with dielectric layer 12 having conductive layer 20 on a second major surface thereof. The first major surface of dielectric layer 12 is covered with a patterned photomask and the exposed portions of dielectric layer 12 are removed to form upper via portion 10*a* (which at this stage is a cavity, i.e., it does not extend all the way through the dielectric layer) as shown in FIG. 7A with the desired diameter and wall slope. Then the outer portion of the newly created cavity floor, as well as the cavity walls and the first major surface of dielectric layer 12, are covered with a photomask, and the central portion of the cavity is further etched all the way through dielectric layer 12 to form lower via portion 10*b*, as shown in FIG. 7B. Subsequently, as shown in FIG. 7C, the walls of upper via portion 10*a* can be coated with a portion of conductive layer 19 that extends from the first major surface of dielectric layer 12 into upper via portion 10*a*. In this case, this portion of conductive layer 19 does not form part of conductive layer 18, but instead is connected to other portions of conductive layer 19. Lower via portion 10*b* is coated with conductive layer 18, which is connected to conductive layer 20 and isolated from conductive layer 19. As shown in FIG. 7D, LESD 26 can be placed at the bottom of via 10 and wire bonded to the portion of conductive layer 19 that extends into upper via portion 10*a*. Thereafter, via 10 may be filled with an encapsulant 30.

Figure 8A:
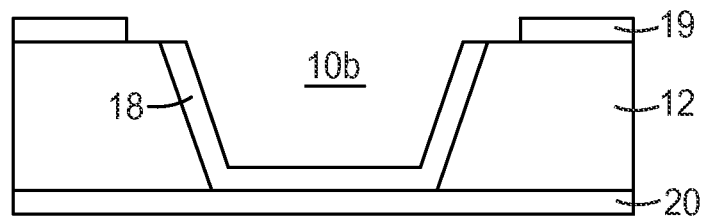
Figure 8B:
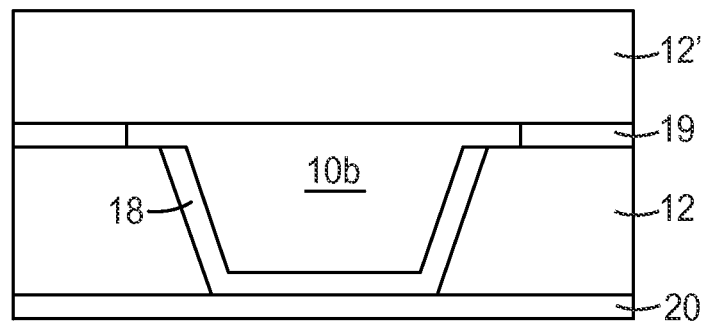
Figure 8C:
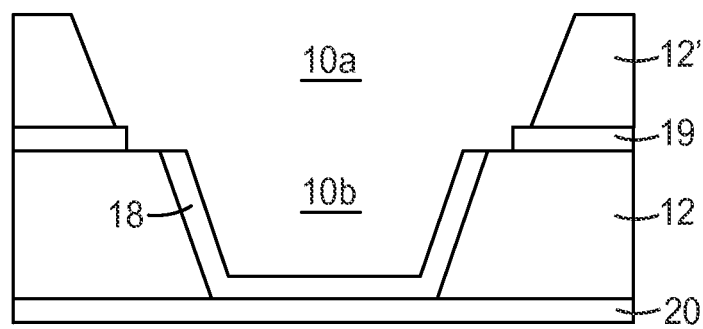

FIGS. 8A-8D illustrates a method of making an alternate embodiment of the present invention, similar to FIGS. 7A-7D, in which the LESD has a height less than the depth of the via. The embodiments of FIGS. 8A-8D as well as 8D' and 8D" differ from the embodiment of FIGS. 7A-7D in that the final embodiments have two dielectric layers 12 and 12' separated by conductive layer 19. In this embodiment, via 10 has a lower portion 10*b* formed in dielectric layer 12 and an upper portion 10*a* formed in dielectric layer 12'. As illustrated in FIG. 8A, the lower via portion 10*b* is formed in dielectric layer 12 first. Conductive layer 19 may be deposited on the surface of dielectric layer 12 before or after lower via portion 10*b* is formed. If deposited afterward, it may be deposited at the same time that conductive layer 18 is deposited in lower via portion 10*b*. As illustrated in FIG. 8B, dielectric layer 12' is applied over conductive layer 19 and lower via portion 10*b*. As illustrated in FIG. 8C, upper via portion 10*a* is then formed in dielectric layer 12'. The diameter of upper via portion 10*a* is typically greater than the diameter of lower via portion 10*b*. The slopes of the upper and lower via portions can be any slopes that are suitable for the desired application and can be the same or different. Each slope will typically be between about 5° to about 90°. As illustrated in FIG. 8D, an LESD 26 may then be placed at the bottom of the via and wire bonded to the portion of conductive layer 19 on dielectric layer 12. In an alternate embodiment, as illustrated in FIG. 8D', conductive layer 19' may be deposited on dielectric layer 12' and an electrical connection may be made between conductive layers 19 and 19' through dielectric layer 12'. In yet another embodiment, as illustrated in FIG. 8D", an electrical connection may be made between conductive layers 19 and 20 through dielectric layer 12, prior to the application of dielectric layer 12'. In any of these embodiments, the walls of upper via portion 10*a* optionally may be coated with additional materials (not shown), such as conductive and reflective materials. Thereafter, via 10 optionally may be filled with an encapsulant (not shown).

Figure 9:
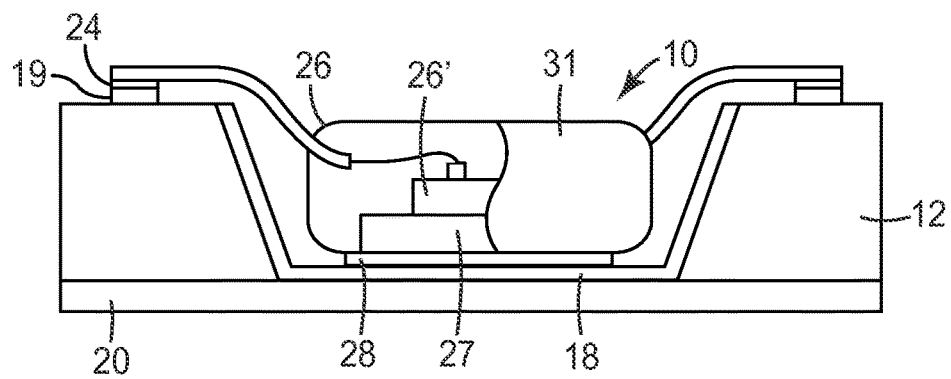
FIG. 9 depicts an embodiment of a flexible LESD of the present invention.

FIG. 9 illustrates an embodiment of the present invention in which a via structure similar to that in FIG. 3 has been formed in the dielectric layer. In this embodiment, LESD 26 is a complete LES package including an LED die 26' and a heat sink 27 surrounded by an encapsulant 31. The body of LESD 26 resides in via 10 and is attached to conductive layer 18 in the via with solder 28, while the contact leads extend to bond pads 24 on conductive layer 19.

Figure 10:
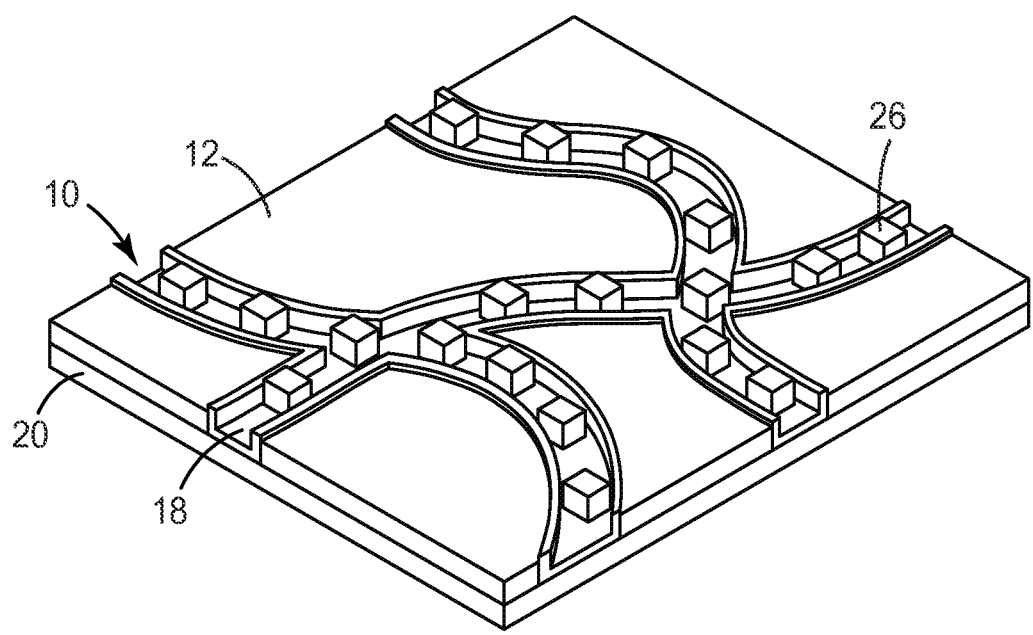
FIG. 10 depicts an embodiment of a flexible LESD of the present invention.

Arrays of LESDs can be formed in any desired pattern. For example, FIG. 10 illustrates an array of LESDs 26 within via 10 formed in dielectric layer 12, the LESDs 26 are located on conductive layer 18, which is in direct contact with conductive layer 20. In this embodiments, the via is a pattern of overlapping serpentine channels.

FIGS. 11A and 11B illustrate a top view and a cross section view, respectively, of a flexible dielectric layer 12 having multiple large vias 10 in which are located multiple LESDs 26 connected in series and in parallel and electrically connected to conductive layer 19 on the surface of flexible dielectric layer 12. The LESDs are supported by conductive layer 18 in via 10 which is adjacent to conductive layer 20. Conductive layer 18 can transfer heat from the LESDs 26 to conductive layer 20.

The flexible LES devices of the present invention can be made in a batch process or a continuous process such as a roll-to-roll process that is often used in making flexible circuits. The LESDs can then be divided as desired, e.g., singulated into individual LESDs, strips of LESDs, or arrays of LESDs, e.g., by stamping or by slitting the LESD articles. Accordingly, an entire reel of flexible LESDs can be shipped without the need for the traditional tape and reel process in which individual LESDs are typically transported in individual pockets of a carrier tape.

Before or after forming individual, strips, or arrays of LESDs, the flexible LESDs can be attached to an additional substrate, for example by attaching the conductive layer on the second major surface of the dielectric layer to the additional substrate with a thermally conductive adhesive. The thermally conductive adhesive can further facilitate the transfer of heat away from the LESD. Alternatively, the conductive layer on the second major surface of the dielectric layer may be treated with metals or other materials that will facilitate its adhesion to a substrate. The substrate may also be thermally conductive, e.g., a rigid metal strip, or may be a semiconductor or ceramic substrate, which may or may not be thermally and/or electrically conductive.

The flexible LES devices can be attached to any desired substrate, depending on their intended use. For example, they can be attached to flexible or rigid metal substrates, such as copper or aluminum, heat sinks, dielectric substrates, circuit boards, etc. If the LES devices are for use on a circuit board, the flexible LES devices, whether in singulated, strip, or array form can be directly attached to an end user's circuit board, thereby eliminating the need for conventional lead frame materials. If the LES devices are for use as a lighting strip, they could be enclosed in a waterproof/weatherproof, transparent casing, as described above.

If the LESDs are in strip or array form, they may be electrically connected to one or more of the other LESDs in the strip or array. Additional elements such as Zener diodes and Schottky diodes can also be added to the top or bottom surface of the flexible dielectric layer, e.g. using direct wafer bonding or flip chip processes, prior to be division of the flexible LES devices. These elements may also be electrically connected to the LESDs.

In at least one embodiment of the present invention, the flexible LESD articles are thinner than conventional single or multiple LESDs because the LESD sits below the surface of the dielectric layer. This enables the flexible LES devices of the present invention to be used in applications with tight volume restrictions, such as cell phones and camera flashes. For example, the flexible LES devices of the present invention can provide a profile of approximately 0.7 to 4 mm, and in some embodiments 0.7 to 2 mm whereas conventional LESD article profiles are typically greater than 4 mm and are approximately 4.8 mm to 6.00 mm. Moreover, in at least one embodiment of the present invention, the flexible LESD can be flexed or bent to easily fit into a non-linear or non-planar assembly if desired.

In at least one embodiment, the dielectric layer and conductive layers thereon provide a thin and compliant support for the LESDs. In at least one embodiment, the total thickness of the conductive layer is less than 200 micrometers, preferably less than 100 micrometers, and most preferably less than 50 micrometers. In at least one embodiment, the thickness of the dielectric layer is preferably 50 micrometers or less.

EXAMPLES

This invention is illustrated by the following examples, but the particular materials and amounts thereof recited in these examples, as well as other conditions and details should not be construed to unduly limit this invention.

Etching Method

The general procedure for preparing the etchants included first dissolving 37 wt % potassium hydroxide (KOH) in water by mixing, followed by the subsequent addition of 3.5 wt % ethylene glycol and 22 wt % ethanolamine. Samples of 50 µm polyimide dielectric layer with 3 µm copper layer clad on one side, available under the trade designation UPISEL-N from UBE Industries, Ltd., Tokyo, Japan, was subjected to selective etching from the PI side using aqueous photoresist, available under the trade designation HM-4056 from Hitachi Chemicals, Japan, as an etch mask. The dielectric layer was etched completely through to the back side of the copper surface.

Circuit-Forming Method

A 20 inch (50.8 cm) wide by 20 m long sample of 50 µm polyimide with 3 µm copper clad on one side, available under the trade designation UPISEL-N from UBE Industries, Ltd., Tokyo, Japan was first slit into a 13.4 inch (34.04 cm) width. Following removal of the 18 µm copper carrier layer from the polyimide (PI) side, vias were formed in the sample by laminating dry film photoresist, available under the trade designation HM4056 from Hitachi Chemicals, Ltd. on both sides and creating a patterned etch mask on the polyimide side using a photolithography process. The sample was then subjected to a chemical etching process using the Etching Method described above to etch the exposed portions of the dielectric completely through to the copper layer on the back side of the polyimide layer. After removing the photoresist from both sides, the exposed PI surface of the sample was first subjected to seeding of a chrome tie layer having a thickness of 2-20 nm by vacuum deposition, then to depositing copper to a thickness of about 100 nm on the tie layer by vacuum deposition to form a conductive coating. The conductive coating was then subjected to electroplating to build up the copper coating to a final thickness of about 3 µm. This provided a structure of a conductive coating in the etched via and on the entirety of the PI dielectric layer. Photoresist was then applied on both sides of the copper clad (on one side) and copper coated (on the other side) dielectric layer and patterned on the copper coated side by a re-registration photolithography process. 45 µm of copper was electrodeposited onto the exposed portions of the thin electrodeposited copper on the etched PI side. Then after the photoresist was removed from the etched PI side, the exposed portions of the 3 µm copper layer and the chrome tie layer were removed to create a circuit patterns on the dielectric layer. This resulted in conductive electrodes having a thickness of 35 µm between the exposed portions of the polyimide layer and a 35 µm copper coating in the etched vias.

Example 1

Following is an example of packaging LESDs on a flexible substrate, specifically, mounting blue LEDs in vias of a flexible dielectric substrate with organic die attach.

Conductive circuits were formed on, and a plurality of vias were formed in, a flexible dielectric layer using the Circuit-Forming Method described above. Each via had a conductive coating of electroplated copper of about 35 µm and a gold reflective coating of about 0.2 µm, resulting in a remaining via depth of about 15 µm. In each via, a Cree EZ 290 Gen II LED, available as part number CA460EZ290-S2100-2 from Cree, Inc., Durham, N.C., U.S.A., was bonded to the reflective/conductive coating using a silver epoxy organic die attach available from Quantum Materials, San Diego, U.S.A. with thermal curing done at 150° C. for 1 hour. Each LED was wire bonded to the conductive circuit on the top surface of the dielectric layer through gold bonding pads using a manual wire bonder, available under the trade designation 4524D from Kulicke and Soffa Industries, Inc., Fort Washington, Pa., U.S.A., with 1 mil diameter gold wire. The assembly was tested using a power supply available as model number EX4210R (voltage rating 42 V, current rating 10 A) from Thurlby Thandar Instruments Limited (TTi), Huntingdon, Cambridgeshire, United Kingdom. The LEDs were bright blue when lit up and the assembly showed flexibility.

Example 2

Following is another example of packaging LESDs on a flexible substrate, specifically, mounting blue LEDs in vias of a flexible dielectric layer with direct die attach bonding.

Conductive circuits were formed on, and a plurality of vias were formed in, a flexible dielectric layer using the Circuit-Forming Method described above. Each via had a conductive coating of electroplated copper of about 35 µm and a plated gold reflective coating of about 0.2 µm, resulting in a remaining via depth of about 15 µm. In each via, a Cree EZ 290 Gen II LED, available as part number CA460EZ290-S2100-2 from Cree, Inc., Durham, N.C., U.S.A., was bonded to the reflective/conductive coating using gold-tin at an 80:20 ratio. Each LED was wire bonded to the conductive circuit on the top surface of the dielectric layer through gold bonding pads using a manual wire bonder, available under the trade designation 4524D from Kulicke and Soffa Industries, Inc., Fort Washington, Pa., U.S.A., with 1 mil diameter gold wire. The assembly was tested using a power supply available as model number EX4210R (voltage rating 42 V, current rating 10 A) from Thurlby Thandar Instruments Limited (TTi), Huntingdon, Cambridgeshire, United Kingdom. The LEDs were bright blue when lit up and the assembly showed flexibility.

Example 3

Following is another example of packaging LESDs on a flexible substrate, specifically, mounting blue LEDs in vias of a flexible dielectric substrate with indirect die bonding.

Conductive circuits were formed on, and a plurality of vias were formed in, a flexible dielectric layer using the Circuit-Forming Method described above. Each via had a conductive coating of electroplated copper of about 35 µm and a plated gold reflective coating of about 0.2 µm, resulting in a remaining via depth of about 15 µm. In each via, a Cree EZ 290 Gen II LED, available as part number CA460EZ290-S2100-2 from Cree, Inc., Durham, N.C., U.S.A., was bonded to the reflective/conductive coating using solder in between the LED and the reflective/conductive coating. Each LED was wire bonded to the conductive circuit on the top surface of the dielectric layer through gold bonding pads using a manual wire bonder, available under the trade designation 4524D from Kulicke and Soffa Industries, Inc., Fort Washington, Pa., U.S.A., with 1 mil diameter gold wire. The assembly was tested using a power supply available as model number EX4210R (voltage rating 42 V, current rating 10 A) from Thurlby Thandar Instruments Limited (TTi), Huntingdon, Cambridgeshire, United Kingdom. The LEDs were bright blue when lit up and the assembly showed flexibility.

Additional embodiments of the present invention include the following:

Embodiment 1

An article comprising:
a flexible polymeric dielectric layer having first and second major surfaces, the dielectric layer having at least one via extending from the first major surface to the second major surface, the first major surface having a first conductive layer thereon and the second major surface having a second conductive layer thereon, the at least one via being defined by walls comprising the dielectric material and the second conductive layer covering the via opening in the second major surface, the at least one via having a third conductive layer on at least a portion of its walls and on at least a portion of the second conductive layer covering the via opening in the second major surface; the third conductive layer configured to directly or indirectly support a light emitting semiconductor device,
wherein the first conductive layer is electrically conductive and the second and third conductive layers are thermally conductive, and
wherein the third conductive layer provides no direct electrical connection between the first and the second conductive layers.

Embodiment 2

The article of embodiment 1 wherein the dielectric layer has an array of vias.

Embodiment 3

The article of embodiments 1 or 2 wherein a light emitting semiconductor device is directly or indirectly bonded to the conductive layer or material in the at least one via.

Embodiment 4

The article of any one of embodiments 1 to 3 wherein a light emitting semiconductor device is wire bonded to the first conductive layer.

Embodiment 5

The article of any one of embodiments 1 to 4 wherein the dielectric layer comprises a polyimide core and thermoplastic polyimide layers on one or both sides of the core.

Embodiment 6

The article of any one of embodiments 1 to 5 wherein the top surface of the at least one via is reflective.

Embodiment 7

The article of embodiment 6 wherein the top surface of the at least one via comprises a reflective material applied over at least a portion of the conductive material in the via.

Embodiment 8

The article of embodiment 7 wherein the reflective material is selected from the group consisting of gold, silver, aluminum with enhanced reflectivity, an inherently reflective dielectric material, and a pigmented material.

Embodiment 9

The article of embodiment 7 further comprising a passivation layer between the reflective material and the light emitting semiconductor device in the at least one via.

Embodiment 10

The article of embodiment 9 wherein the passivation layer comprises gold:tin and the reflective layer comprises gold.

Embodiment 11

The article of any one of embodiments 1 to 10 wherein the at least one via is filled with phosphor-filled encapsulant.

Embodiment 12

A method comprising:
providing a flexible dielectric layer having a first major surface and a second major surface;
creating at least one via extending from the first major surface to the second major surface of the dielectric layer;
creating a conductive layer on the first and second major surfaces of the dielectric layer; and
applying a conductive layer in the at least one via such that the conductive layer in the via is in electrical contact with the conductive layer on the second major surface of the dielectric layer;

Embodiment 13

The method of embodiment 12 further comprising bonding a light emitting semiconductor device directly or indirectly to the conductive layer in the at least one via; and electrically connecting the light emitting semiconductor device to the conductive layer on the first major surface of the dielectric layer.

Although specific embodiments have been illustrated and described herein for purposes of description of the preferred embodiment, it will be appreciated by those of ordinary skill in the art that a wide variety of alternate and/or equivalent implementations may be substituted for the specific embodiments shown and described without departing from the scope of the present invention. This application is intended to cover any adaptations or variations of the preferred embodiments discussed herein. Therefore, it is manifestly intended that this invention be limited only by the claims and the equivalents thereof.

What is claimed is:

1. An article for supporting a light emitting semiconductor device, the article comprising:
a flexible polymeric dielectric layer having first and second major surfaces, the dielectric layer having an array of vias extending from the first major surface to the second major surface, the first major surface having a first conductive layer thereon and the second major surface having a second conductive layer thereon, the vias being defined by walls comprising the dielectric material and the second conductive layer covering the via opening in the second major surface, at least one via having a third conductive layer on at least a portion of the walls of the via and on at least a portion of the second conductive layer covering the via opening in the second major surface; the third conductive layer configured to directly or indirectly support the light emitting semiconductor device,
wherein the first conductive layer is electrically conductive and the second and third conductive layers are thermally conductive, and
wherein the third conductive layer provides no direct electrical connection between the first and the second conductive layers, wherein the flexible polymeric dielectric layer has a thickness of 50 micrometers or less,
wherein the at least one via is at least 25% filled with conductive material in addition to the third conductive layer, and the article further comprising a reflective coating or solder covering the conductive material.

2. The article of claim 1 wherein the first conductive layer is electrically and thermally conductive.

3. The article of claim 1 wherein the second conductive layer is thermally and electrically conductive.

4. The article of claim 1 wherein the third conductive layer is thermally and electrically conductive.

5. The article of claim 1 wherein the third conductive layer comprises a portion of the first conductive layer that extends into the via but is electrically isolated from the remaining portion of the first conductive layer.

6. The article of claim 1 wherein the first conductive layer comprises a circuit.

7. The article of claim 1 wherein the second conductive layer comprises a circuit.

8. The article of claim 1 wherein the third conductive layer is configured to directly or indirectly support an LESD that is electrically connected to the first conductive layer.

9. The article of claim 1 wherein the third conductive layer is configured to directly or indirectly support an LESD that is electrically connected to the second conductive layer.

10. The article of claim 1 wherein the at least one via has walls that slope from the first major surface to the second major surface of the dielectric layer at an angle of about 5° to about 60° as measured from the major plane of the dielectric layer.

11. The article of claim 1 wherein the second conductive layer comprises a thermally conductive adhesive.

12. The article of claim 1 wherein the light emitting semiconductor device is supported by the third conductive layer in the via and is one selected from the group consisting of a bare die, a bare die LES construction, an intermediate LES construction, and a complete packaged LES construction.

13. The article of claim 1 wherein the ratio of the footprint area of the light emitting semiconductor device to the area of the via opening in the second major surface of the dielectric layer is about 1:2 to about 1:4.

14. The article of claim 1 wherein the ratio of the footprint area of the light emitting semiconductor device to the area of the via opening in the second major surface of the dielectric layer is about 1:3.

15. The article of claim 1 wherein the first and third conductive layers have thickness of about 50 micrometers to about 100 micrometers.

16. The article of claim 1 wherein the at least one via has an upper portion near the first major surface of the flexible dielectric layer and a lower portion near the second major surface and wherein the diameter of the upper portion of the via is greater than the diameter of the lower portion of the via.

17. The article of claim 1 further comprising a second polymeric dielectric layer on the first conductive layer, the second polymeric dielectric layer having an opening extending therethrough and aligned with the at least one via such that the opening forms an upper portion of the via.

18. The article of claim 1 wherein the third conductive layer covers the second conductive layer along the via opening in the second major surface.

* * * * *